(12) United States Patent
Kamenitsa et al.

(10) Patent No.: US 10,087,520 B2
(45) Date of Patent: Oct. 2, 2018

(54) IMPLANTATION USING SOLID ALUMINUM IODIDE (ALI3) FOR PRODUCING ATOMIC ALUMINUM IONS AND IN SITU CLEANING OF ALUMINUM IODIDE AND ASSOCIATED BY-PRODUCTS

(71) Applicant: Axcelis Technologies, Inc., Beverly, MA (US)

(72) Inventors: Dennis Elliott Kamenitsa, Austin, TX (US); Richard J. Rzeszut, Billerica, MA (US); Fernando M. Silva, Gloucester, MA (US); Neil K. Colvin, Merrimack, NH (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 15/627,952

(22) Filed: Jun. 20, 2017

(65) Prior Publication Data
US 2017/0362699 A1     Dec. 21, 2017

Related U.S. Application Data

(60) Provisional application No. 62/352,673, filed on Jun. 21, 2016.

(51) Int. Cl.
*C23C 16/12*     (2006.01)
*C01B 7/13*     (2006.01)
(Continued)

(52) U.S. Cl.
CPC .............. *C23C 16/12* (2013.01); *C01B 7/135* (2013.01); *C01B 31/36* (2013.01); *C01F 7/48* (2013.01);
(Continued)

(58) Field of Classification Search
CPC ................................ C01B 7/135; C01B 31/36
See application file for complete search history.

(56) References Cited

U.S. PATENT DOCUMENTS

| 6,818,909 B2 | 11/2004 | Murrell et al. |
| 2003/0038246 A1 | 2/2003 | Reyes |
| (Continued) | | |

OTHER PUBLICATIONS

International Search Report and Written Opinion dated Sep. 27, 2017, in connection with International Application No. PCT/US2017/038422.

*Primary Examiner* — Errol Fernandes
(74) *Attorney, Agent, or Firm* — Eschweiler & Potashnik, LLC

(57) ABSTRACT

An ion implantation system is provided having an ion source configured to form an ion beam from aluminum iodide. A beamline assembly selectively transports the ion beam to an end station configured to accept the ion beam for implantation of aluminum ions into a workpiece. The ion source has a solid-state material source having aluminum iodide in a solid form. A solid source vaporizer vaporizes the aluminum iodide, defining gaseous aluminum iodide. An arc chamber forms a plasma from the gaseous aluminum iodide, where arc current from a power supply is configured to dissociate aluminum ions from the aluminum iodide. One or more extraction electrodes extract the ion beam from the arc chamber. A water vapor source further introduces water to react residual aluminum iodide to form hydroiodic acid, where the residual aluminum iodide and hydroiodic acid is evacuated from the system.

20 Claims, 4 Drawing Sheets

(51) Int. Cl.
  *C01B 31/36* (2006.01)
  *C01F 7/48* (2006.01)
  *C23C 16/448* (2006.01)
  *H01L 21/02* (2006.01)
  *H01L 21/306* (2006.01)
  *C23C 14/48* (2006.01)
  *H01J 37/317* (2006.01)
  *H01L 21/265* (2006.01)

(52) U.S. Cl.
  CPC ............ *C23C 14/48* (2013.01); *C23C 16/448* (2013.01); *H01J 37/3171* (2013.01); *H01L 21/02019* (2013.01); *H01L 21/02167* (2013.01); *H01L 21/26506* (2013.01); *H01L 21/306* (2013.01); *H01J 2237/022* (2013.01); *H01J 2237/08* (2013.01); *H01J 2237/31705* (2013.01)

(56) References Cited

U.S. PATENT DOCUMENTS

| | | |
|---|---|---|
| 2009/0294698 A1 | 12/2009 | Ray |
| 2014/0329025 A1 | 11/2014 | Cleary |
| 2015/0087108 A1* | 3/2015 | Salabas ................ H01L 31/072 438/96 |

\* cited by examiner

IMPLANTATION USING SOLID ALUMINUM IODIDE (ALI3) FOR PRODUCING ATOMIC ALUMINUM IONS AND IN SITU CLEANING OF ALUMINUM IODIDE AND ASSOCIATED BY-PRODUCTS

REFERENCE TO RELATED APPLICATIONS

This application claims the benefit of U.S. Provisional Application No. 62/352,673 filed Jun. 21, 2016, entitled "IMPLANTATION USING SOLID ALUMINUM IODIDE (ALI3) FOR PRODUCING ATOMIC ALUMINUM IONS AND IN SITU CLEANING OF ALUMINUM IODIDE AND ASSOCIATED BY-PRODUCTS", the contents of which are herein incorporated by reference in their entirety.

TECHNICAL FIELD

The present invention relates generally to ion implantation systems, and more specifically to an ion implantation system for implanting aluminum ions utilizing an aluminum iodide ion source material and associated beamline components with mechanisms for in-situ cleaning of the ion implantation system.

BACKGROUND

Ion implantation is a physical process that is employed in semiconductor device fabrication to selectively implant dopant into semiconductor and/or wafer material. Thus, the act of implanting does not rely on a chemical interaction between a dopant and semiconductor material. For ion implantation, dopant atoms/molecules from an ion source of an ion implanter are ionized, accelerated, formed into an ion beam, analyzed, and swept across a wafer, or the wafer is swept through the ion beam. The dopant ions physically bombard the wafer, enter the surface and come to rest below the surface, at a depth related to their energy.

Ion sources in ion implanters typically generate the ion beam by ionizing a source material in an arc chamber, wherein a component of the source material is a desired dopant element. The desired dopant element is then extracted from the ionized source material in the form of the ion beam.

Conventionally, when aluminum ions are the desired dopant element, materials such as aluminum nitride (AlN) and alumina ($Al_2O_3$) have been used as a source material of aluminum ions for the purpose of ion implantation. Aluminum nitride or alumina are solid, insulative materials which are typically placed in the arc chamber where the plasma is formed (in the ion source).

A gas is conventionally introduced (e.g., fluorine) to chemically etch the aluminum-containing materials, whereby the source material is ionized, and aluminum is extracted and transferred along the beamline to silicon carbide workpiece positioned in an end station for implantation thereto. The aluminum-containing materials, for example, are commonly used with some form of etchant gas (e.g., $BF_3$, $PF_3$, $NF_3$, etc.) in the arc chamber as the source material of the aluminum ions. These materials, however, have the unfortunate side effect of producing insulating material (e.g., AlN, $Al_2O_3$, etc.) which is emitted along with the intended aluminum ions from the arc chamber.

The insulating material subsequently coats various components of the ion source, such as extracting electrodes, which then begin to build an electric charge and unfavorably alter the electrostatic characteristic of the extraction electrodes. The consequence of the electric charge build-up results in behavior commonly referred to as arcing, or "glitching", of the extraction electrodes as the built-up charge arcs to other components and or to ground. In extreme cases, behavior of a power supply for the extraction electrodes can be altered and distorted. This typically results in unpredictable beam behavior and leads to reduced beam currents and frequent preventive maintenance to clean the various components associated with the ion source. Additionally, flakes and other residue from these materials can form in the arc chamber, thus altering its operational characteristics, leading to additional frequent cleaning.

SUMMARY

The present disclosure overcomes the limitations of the prior art by providing a system, apparatus, and method for improving performance and extending the lifetime of an ion source in an ion implantation system for aluminum implants. Accordingly, the following presents a simplified summary of the disclosure in order to provide a basic understanding of some aspects of the disclosure. This summary is not an extensive overview of the disclosure. It is intended to neither identify key or critical elements of the invention nor delineate the scope of the invention. Its purpose is to present some concepts of the disclosure in a simplified form as a prelude to the more detailed description that is presented later.

Aspects of the disclosure facilitate ion implantation processes for implanting aluminum ions into a workpiece. According to one exemplary aspect, an ion source for an ion implantation system comprises a solid-state material source comprising aluminum iodide in a solid form. In one example, the aluminum iodide is in one or more a powder form, a granular form, and a bulk solid form.

The ion implantation system, for example, further comprises a beamline assembly configured to selectively transport the ion beam, wherein an end station is configured to accept the ion beam for implantation of aluminum ions into a workpiece.

A solid source vaporizer, for example, is configured to vaporize the aluminum iodide, thus defining gaseous aluminum iodide. A power supply may be operably coupled to an arc chamber configured to form a plasma from the gaseous aluminum iodide, wherein arc current from the power supply is configured to dissociate aluminum ions from the aluminum iodide. Further, one or more extraction electrodes may be configured to extract an ion beam from the arc chamber, wherein the ion beam is comprised of aluminum ions.

According to one example, the solid source vaporizer comprises one or more heating elements configured to heat the aluminum iodide to a vaporization temperature between approximately 90° C. and 100° C.

In accordance with another example, an extraction power supply is further provided and associated with the one or more extraction electrodes. The one or more extraction electrodes, for example, comprise an extraction aperture, wherein an extraction current from the extraction power supply is configured to extract the ion beam through the extraction aperture.

According to another example, a vacuum system is provided and configured to selectively substantially evacuate one or more components of the ion implantation system, such as the arc chamber. According to another example, a water introduction apparatus is further provided and configured to introduce water vapor to the one or more components of the ion implantations system, such as the ion source. In yet another example, a co-gas source is provided and configured to provide a co-gas to the arc chamber for aiding in the formation of the plasma.

In accordance with another exemplary aspect of the disclosure, a method for implanting aluminum ions into a workpiece is provided. In one example, the method comprises vaporizing a solid aluminum iodide source material, therein defining a vaporized aluminum iodide source material. The vaporized aluminum iodide source material is provided to an ion source of an ion implantation system, and the aluminum iodide source material is ionized in the ion source. An ion beam containing aluminum ions is further extracted from the ion source and directed toward a workpiece, thereby implanting the aluminum ions into the workpiece.

According to one example, one or more of residual aluminum iodide and hydroiodic acid are formed on one or more internal components of the ion implantation system, and cleaned therefrom. Cleaning the one or more of the residual aluminum iodide and hydroiodic acid, for example, comprises introducing water vapor to the internal components of the ion implantation system, wherein the water vapor reacts with the residual aluminum evacuating the ion implantation system to form hydroiodic acid. Further, the reacted residual aluminum iodide and unreacted aluminum iodide are removed from the ion implantation system by evacuating the ion implantation system via a vacuum system. The water vapor may be introduced in-situ, wherein the water vapor may be further iteratively introduced and the system evacuated to remove the residual aluminum iodide and hydroiodic acid.

According to another example, a shut down beam is performed concurrent with introducing water vapor to the ion implantation system. The shut down beam comprises maintaining an active argon plasma in the arc chamber, thereby substantially preventing a non-ionizing environment concurrent with cooling down the ion implantation system.

The above summary is merely intended to give a brief overview of some features of some embodiments of the present disclosure, and other embodiments may comprise additional and/or different features than the ones mentioned above. In particular, this summary is not to be construed to be limiting the scope of the present application. Thus, to the accomplishment of the foregoing and related ends, the disclosure comprises the features hereinafter described and particularly pointed out in the claims. The following description and the annexed drawings set forth in detail certain illustrative embodiments of the disclosure. These embodiments are indicative, however, of a few of the various ways in which the principles of the disclosure may be employed. Other objects, advantages and novel features of the disclosure will become apparent from the following detailed description of the disclosure when considered in conjunction with the drawings.

DETAILED DESCRIPTION

Figure 1:
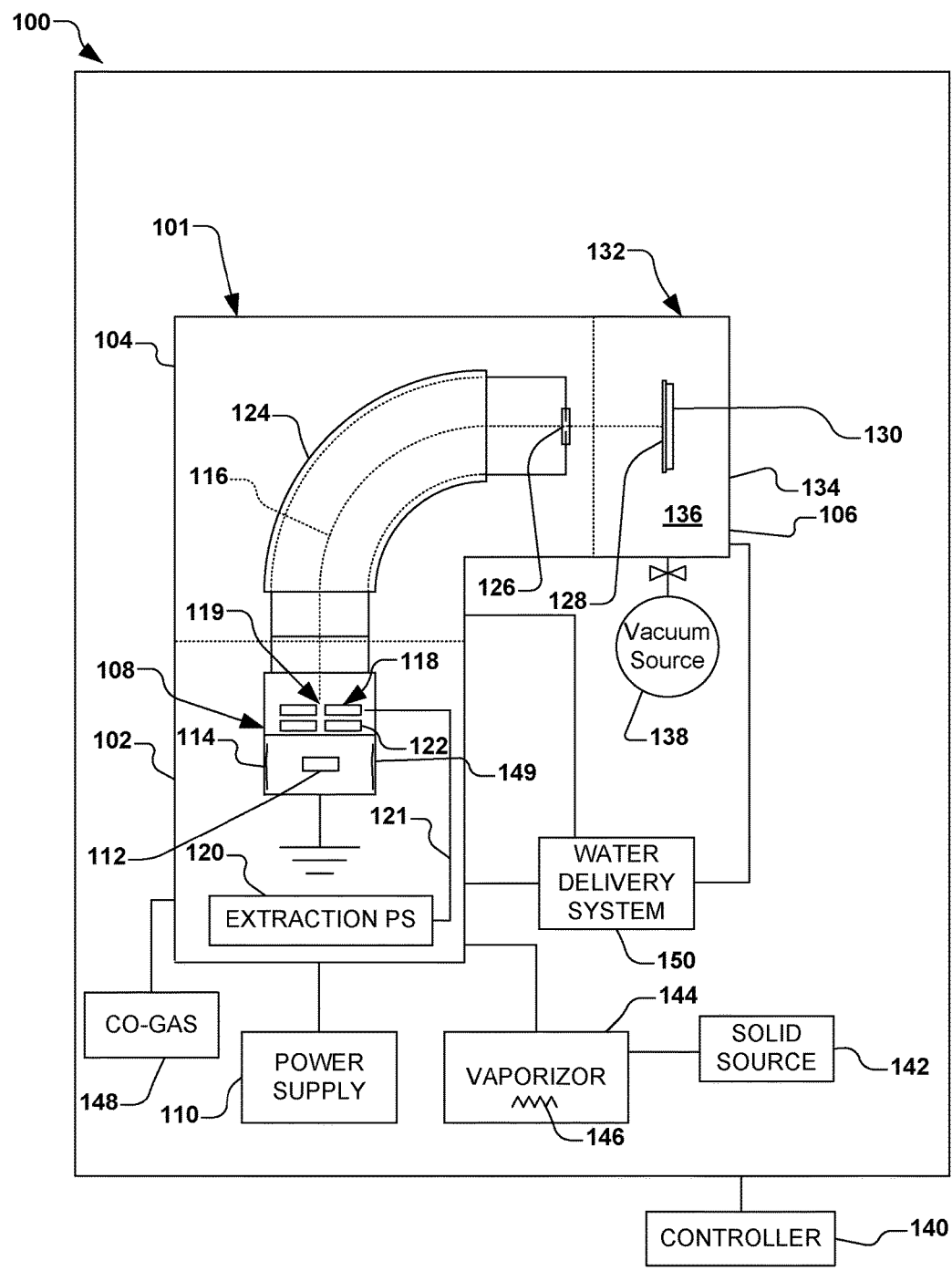
FIG. 1 is a block diagram of an exemplary vacuum system utilizing an aluminum iodide ion source material in accordance with several aspects of the present disclosure.

The present disclosure is directed generally toward an ion implantation system and an ion source material associated therewith. More particularly, the present disclosure is directed toward components for said ion implantation system using an aluminum iodide ($AlI_3$) solid source material for producing atomic aluminum ions to electrically dope silicon, silicon carbide, or other semiconductor substrates at various temperatures, ranging up to 1000 C. Further, the present disclosure provide in-situ cleaning of aluminum Iodide and its by-products during and/or after its use in an ion implantation process.

Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented as a wireless communication, unless noted to the contrary.

In accordance with one aspect of the present disclosure, FIG. 1 illustrates an exemplary vacuum system 100. The vacuum system 100 in the present example comprises an ion implantation system 101, however various other types of vacuum systems are also contemplated, such as plasma processing systems, or other semiconductor processing systems. The ion implantation system 101, for example, comprises a terminal 102, a beamline assembly 104, and an end station 106.

Generally speaking, an ion source 108 in the terminal 102 is coupled to a power supply 110. The ion source 108 is configured to ionize an ion source material 112 into a plurality of ions in an arc chamber 114, and to form and extract an ion beam 116 therefrom via one or more extraction electrodes 118. The one or more extraction electrodes 118, for example, comprise an extraction aperture 119 through which the ion beam 116 is extracted and defined. An extraction power supply 120, for example, is associated with the one or more extraction electrodes 118. An extraction current 121 supplied to the one or more extraction electrodes 118 from the extraction power supply 120, for example, is configured to extract the ion beam 116 through the extraction aperture 119. Individual electrodes 122 in close proximity to the extraction aperture 119, for example, may be biased to inhibit back streaming of neutralizing electrons close to the arc chamber 114 or back through the extraction aperture. In accordance with one example of the present disclosure, the ion source material 112 is provided in the arc chamber 114 of the ion source 108, wherein the ion source material comprises aluminum iodide ($AlI_3$), as will be discussed in further detail infra.

The ion beam 116 in the present example is directed through a beam-steering apparatus 124, and out an aperture 126 towards the end station 106. In the end station 106, the ion beam 116 bombards a workpiece 128 (e.g., a semiconductor such as a silicon wafer, silicon carbide, a display panel, etc.), which is selectively clamped or mounted to a chuck 130 (e.g., an electrostatic chuck or ESC). Once embedded into the lattice of the workpiece 128, the implanted ions change the physical and/or chemical properties of the workpiece. Because of this, ion implantation is used in semiconductor device fabrication and in metal finishing, as well as various applications in materials science research.

The ion beam 116 of the present disclosure can take any form, such as a pencil or spot beam, a ribbon beam, a scanned beam, or any other form in which ions are directed toward end station 106, and all such forms are contemplated as falling within the scope of the disclosure.

According to one exemplary aspect, the end station 106 comprises a process chamber 132, such as a vacuum chamber 134, wherein a process environment 136 is associated with the process chamber. The process environment 136 generally exists within the process chamber 132, and in one example, comprises a vacuum produced by a vacuum system 138 (e.g., a vacuum pump) coupled to the process chamber and configured to substantially evacuate the process chamber. It is noted that the vacuum system 138 may be configured to selectively substantially evacuate various other components of the vacuum system 100, such as any components associated with the terminal 102, beamline assembly 104, and end station 106. For example, the vacuum system 138 may be advantageously configured to substantially evacuate the arc chamber 114 of the ion source 108. Furthermore, a controller 140 is provided for overall control of the vacuum system 100.

The present disclosure appreciates that workpieces 128 having silicon carbide solid state based devices (not shown) formed thereon have been found to have better thermal and electrical characteristics than silicon-based devices. Silicon carbide solid state devices, for example, have better thermal and electrical characteristics than traditional silicon solid-state devices in applications where conversion of large amounts of relatively high voltage at potentially high temperatures. For example, silicon carbide-based devices may be advantageously implemented in high voltage and high temperature devices, such as electric cars, etc.

Ion implantation into workpieces 128 comprising silicon carbide, however, utilizes a different class of implant dopants than those used for silicon workpieces. When implanting ions into a workpiece 128 comprising silicon carbide, for example, aluminum and nitrogen implants are often performed, whereby aluminum and nitrogen ions are respectively implanted into the workpiece. Nitrogen implants, for example, are relatively simple, as nitrogen may be introduced into the ion source 108 as a gas, whereby the ionization and extraction of nitrogen ions associated with the nitrogen implants provide for relatively easy tuning, cleanup, etc. Ionization and extraction of aluminum ions associated with aluminum implants, however, is more difficult, as there are presently few good gaseous source solutions of aluminum that are known.

Accordingly, the present disclosure contemplates implementing aluminum iodide ($AlI_3$) as the ion source material 112 in order to produce atomic aluminum ions in the ion source 108. Heretofore, aluminum iodide has not been implemented as the ion source material 112, and the inventors presently appreciate that the implementation of aluminum iodide reduces the formation of insulating materials and flakes, etc. that have been conventionally encountered in aluminum ion implants. As such, the insulating materials seen in conventional aluminum ion implants are not produced and do not build up in or on various components associated with the ion source when aluminum iodide is utilized as the source material 112. Accordingly, a lifetime of the ion source 108 and extraction electrodes 118 is advantageously increased, a more stable ion beam 116 is produced during operation of the ion implantation system 101, and substantially higher beam currents are permitted by utilizing aluminum iodide as the ion source material 112.

The present disclosure inventively appreciates that single atom aluminum ions may be produced when aluminum iodide is provided in a solid form as the source material 112 in the ion source 108, whereby the aluminum ions may be utilized to electrically dope workpieces 128 comprising silicon carbide, silicon, or other materials at temperatures ranging from room temperature to 1000 C. As such, by utilizing aluminum iodide ($AlI_3$) as the source material 112, the present disclosure provides improved lifetimes of the ion source 108, improved beam currents, and various other improved operational characteristics of the ion implantation system 101 over previously-known techniques.

Thus, in accordance with the present disclosure, aluminum iodide ($AlI_3$) is provided as a solid-state material source 142 that is inserted into a solid source vaporizer 144 (e.g., a cylindrical oven) associated with the ion implantation system 101. The ion implantation system 101, for example, may comprise a suitable ion implanter manufactured by Axcelis Technologies, Inc. of Beverley, Mass. For example, the aluminum iodide is placed into the solid source vaporizer 144 in one or more a powder form, granular form, and bulk solid form. After insertion of the solid source vaporizer 144 the aluminum iodide is heated to a vaporization temperature (e.g., 90-100° C.) to produce the evolution of sufficient gaseous material to be introduced into the arc chamber 114 of the ion source 108 as the source material 112 to form a plasma. The formation of the plasma may be accomplished with or without a co-gas 148, such as argon, to help initiate the formation of the plasma in the arc chamber 114. For example, the solid source vaporizer 144 comprises a heating apparatus 146 (e.g., one or more heating elements or heating coils) configured to heat the aluminum iodide to the vaporization temperature.

When the aluminum iodide reaches the appropriate temperature in the solid source vaporizer 144 (e.g., the vaporization temperature), enough material is evolved such that a stable plasma can be produced in the arc chamber 114 of the ion source 108 by the alumni iodide alone, or in combination with the co-gas 148. Accordingly, single atom aluminum ions are then electrostatically extracted via the extraction electrodes 118 to form the ion beam 116 which is further manipulated and transported to the workpiece 128 to be implanted with the aluminum.

The present disclosure further provides a technique of in-situ cleaning of aluminum iodide and any of its by-products from the ion source 108 and surrounding regions resulting from using aluminum iodide ($AlCl_3$, etc.) as an aluminum source material for implanting atomic aluminum ions into the workpiece 128 comprising silicon, silicon carbide, or other semiconductor substrates.

As discussed above, aluminum iodide may be provided from the solid-state material source 142 to the solid source vaporizer 144 in the ion implantation system 101. The aluminum iodide, for example, is vaporized by heating it to an appropriate temperature in the solid source vaporizer 144, whereby the resulting aluminum iodide vapor is dissociated, then ionized, in the arc chamber 114 of the ion source 108 in order to produce atomic aluminum ions which are extracted in the form of the ion beam 116 for the ion implantation process. It is noted that un-ionized (e.g., molecular or non-dissociated) material associated with the aluminum iodide may accumulate on interior surfaces of the ion implantation system 101, or they break down into various components. The main components of such break down of aluminum iodide, for example, are aluminum iodide, aluminum, iodine, and hydrogen iodide. As discussed above, aluminum is the desired target material constituent of the ion beam 116 for the ion implantation process, and iodine is relatively inert when it exists throughout the ion implantation system 101. Hydrogen iodide, however, is reactive, and has a tendency to break down chemically to form hydroiodic acid, which is a strongly corrosive acid.

The solid source vaporizer 144 associated with the ion source 108, for example, may be manually loaded with the source material 112 (aluminum iodide) from solid-state material source 142 in an inert environment (e.g., an argon, nitrogen, or other inert gas environment) so as not to start a reaction of the source material with moisture in the air. For example, one or more of the solid source vaporizer 144 and the ion source 108 may be separated from the ion implantation system 101 and placed in a "glove box" for manual loading of the source material 112 in the inert environment. The ion source 108 and/or solid source vaporizer 144 may then be re-installed in the ion implantation system 101, whereby at least the ion source 108 is pumped down with vacuum to an operating pressure of the ion implantation system.

The source material 112 (aluminum iodide), for example, is heated in the solid source vaporizer 144 until it forms a vapor (e.g., gaseous phase), whereby the vapor migrates or is otherwise introduced to the arc chamber 114, where the aluminum is ionized, extracted as the ion beam 116, and transported toward the workpiece 128, as discussed above. Un-reacted aluminum iodide has a tendency to re-solidify on colder surfaces (e.g., surfaces at temperatures less than approximately 90-100° C.), such as internal surfaces 149 associated with the ion source 108, as well as other beam-line components. The aluminum iodide tends to not re-solidify on hotter surfaces (e.g., surfaces at temperatures greater than approximately 90-100° C.), due to the vaporization temperature of the aluminum iodide.

The present disclosure appreciates that hydrogen iodide, which is a byproduct of a reaction with hydrogen or hydrogen-containing compounds such as water, can form or otherwise coat the internal surfaces 149 of the ion source 108 (and other beam line components). For example, when the aluminum iodide material in the solid source vaporizer 144 is depleted, the ion source 108 may be removed from the ion implantation system 101, whereby the ion source may be cleaned and reloaded with aluminum iodide to continue the process. It is at this time, however, that the un-reacted aluminum iodide and hydrogen iodide on the internal surfaces 149 of the ion source 108 may be exposed to moisture-containing air to form additional hydrogen iodide and hydroiodic acid.

However, the present disclosure advantageously appreciates that if the aluminum iodide is exposed to water vapor in-situ, a liquid-like residue may be formed, whereby the liquid-like residue may be pumped out and removed via the vacuum system 138 (e.g., a toxic gas exhaust or other vacuum system). Thus, the present disclosure contemplates an in-situ exposure of the ion source 108 and/or other components of the ion implantation system 101 to water vapor to aid in cleaning and maintenance, thereof. For example, the in-situ exposure may be periodic, such as during a daily shut-down cycle, or it may be performed in a single series of exposures (e.g., purge and pump cycles) at the end of the lifetime of the ion source. Alternatively, a separate, dedicated vessel may be utilized for the cleaning of the ion source 108.

The introduction of water vapor to various portions within the housing of the ion source 108 at predetermined times can advantageously react the hydrogen iodide and the hydroiodic acid to allow it to be removed by the vacuum system 138 and to aid in neutralizing any remaining material in order for the remaining material to be cleaned with a basic solution, such as isopropyl alcohol, or other less-hazardous solvents. The introduction of water vapor, for example, may be controlled to react the aluminum iodide byproducts in a safe manner to minimize deleterious chemical reactions and/or corrosive aspects.

The present disclosure appreciates that without the aforementioned in-situ cleaning using water, significant amounts of unreacted aluminum iodide and hydroiodic acid formed on the internal surfaces 149 may lead to special decontamination protocols and disposal. Thus, the present disclosure addresses the introduction of water vapor into the vacuum system 100 (or alternatively, an external vessel) to intentionally permit the formation of aluminum iodide by-products (e.g., through out-gassing), and to account for the removal of these by-products, via the vacuum system 138. The removal of the aluminum iodide by-products, for example, can be accomplished in-situ during regular machine shutdown periods, such as by utilizing a standby beam operation (e.g., overnight). Alternatively, the removal of the aluminum iodide by-products, can be accomplished in-situ at the end of the lifetime of the ion source 108 or vaporizer 144 via a series of individual purge/pump cycles, or via a single purge, followed by a pump down cycle. The present disclosure further contemplates the purge/pump or single purge to transpire at higher pressures, such as atmospheric pressure. A dedicated external vessel (not shown) can be further provided for the above-mentioned purging and pumping.

Figure 2:
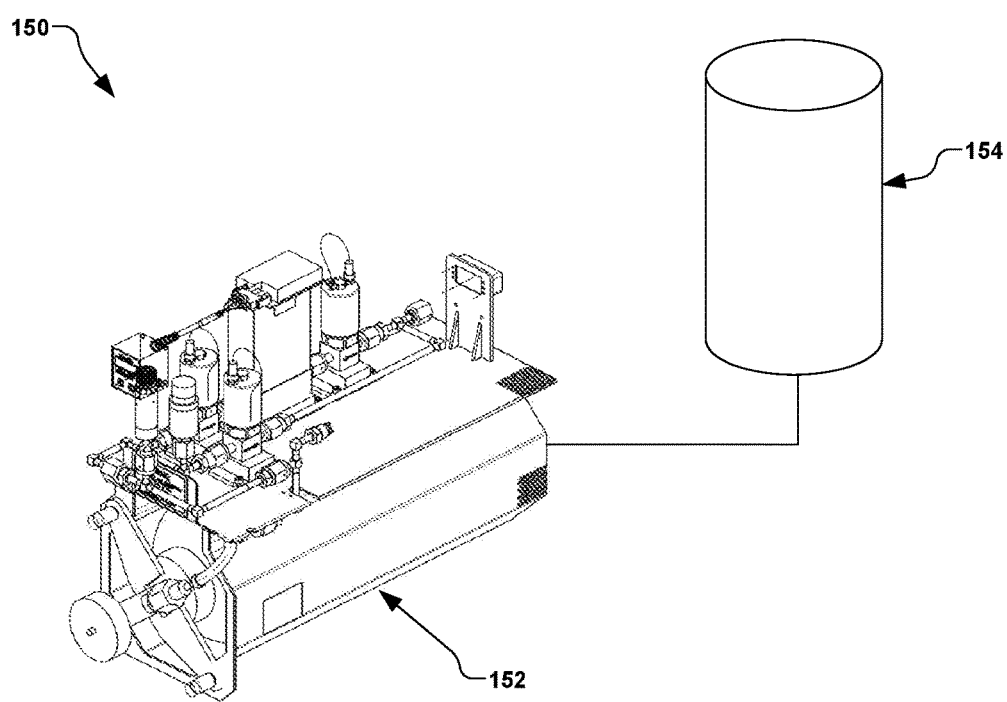
FIG. 2 illustrates an exemplary vaporizer in accordance with another aspect of the present disclosure.

The introduction of water or water vapor to the vacuum system 100 may be accomplished by a water delivery system 150. An exemplary water delivery system 150 is illustrated in FIG. 2, wherein a water introduction apparatus 152, such as Axcelis Technologies, Inc. of Beverly, Mass. part number 110126300, is configured to receive water from a water reservoir 154 for the in-situ introduction of water or water vapor to the vacuum system 100 of FIG. 1.

The present disclosure thus utilizes powdered or otherwise solid aluminum iodide that is placed in the 144 vaporizer and heated to a vaporization temperature (e.g., via the heating apparatus 146). The aluminum iodide is thus vaporized, whereby the vaporized material is transferred to the arc chamber 114 of the ion source 108, where it further is ionized and transported along the beamline to be implanted into the workpiece 128.

Figure 3:
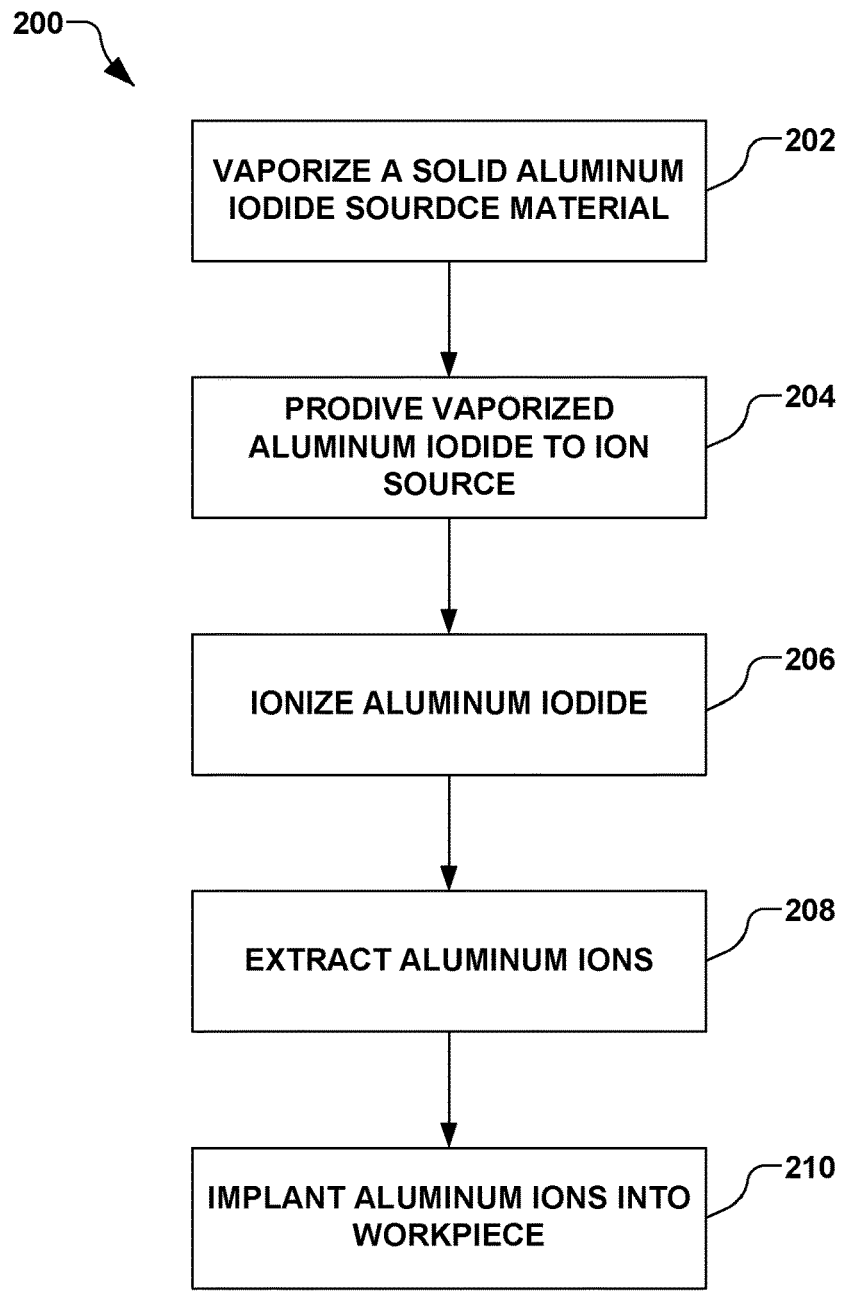
FIG. 3 illustrate an exemplary method for implanting aluminum ions into a workpiece using aluminum iodide as a source material.

FIG. 3 illustrates an exemplary method 200 is provided for implanting aluminum ions into a workpiece. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 3, the method 200 begins in act 202 by vaporizing a solid aluminum iodide source material, therein defining a vaporized aluminum iodide source material. The solid aluminum iodide source material provided in act 202, for example, is initially in one of a powder form, a granular form, and a bulk solid form.

In act 204, the vaporized aluminum iodide source material is provided to an ion source of an ion implantation system, such as the ion source 108 of the ion implantation system 101 of FIG. 1. In act 206 of FIG. 3, the aluminum iodide source material is ionized in the ion source. In act 208, an ion beam containing aluminum ions is extracted from the ion source, such as via the one or more electrodes 118 of FIG. 1. In act 210 of FIG. 3, the ion beam is directed toward a workpiece, thereby implanting the aluminum ions into the workpiece.

In accordance with one example, upon performing one or more of acts 206, 208, and 210, one or more of residual aluminum iodide and hydroiodic acid may be formed on one or more internal components of the ion implantation system, whereby the one or more of the residual aluminum iodide and hydroiodic acid may be further cleaned from the one or more internal components of the ion implantation system. For example, cleaning one or more of the residual aluminum iodide and hydroiodic acid may comprise introducing water vapor to the internal components of the ion implantation system and evacuating the ion implantation system, therein substantially removing the water vapor and residual aluminum iodide and hydroiodic acid.

In another example, the water vapor may be introduced to the internal components of the ion implantation system by introducing one or more of atmospheric air and vaporized water to the internal components of the ion implantation system.

The present disclosure further appreciates that aluminum iodide is traditionally a difficult material to handle, as it is an hygroscopic material which absorbs water from the atmosphere to form hydroiodic acid. Accordingly, aluminum iodide and its byproducts are traditionally difficult to handle (e.g., a glove box with inert gas is typically used to handle the material), and components which come into contact with the byproducts are often carefully cleaned after use, etc. However, the present disclosure contemplates utilizing aluminum iodide for aluminum implants in an ion implantation system by providing aluminum iodide in vaporizer at a desired processing temperature (e.g., temperatures ranging from 90-100° C.), whereby the aluminum iodide performs well without producing insulative or otherwise deleterious byproducts seen previously in the use of alumina, etc.

As with any source material, residual materials are left behind after the use of aluminum iodide. When implanting with gaseous source materials, the residual materials can be pumped out of the system via the vacuum system. When implanting utilizing solid source materials, however, the residual is usually a solid that emerges from the ion source un-ionized, whereby the un-ionized material coats the next cool surface that it encounters along the beamline. With aluminum iodide, the un-ionized aluminum iodide can coat cooler components along the beamline. Further, since the aluminum iodide is hygroscopic, the removal of components and subsequent exposure to water vapor in the air can cause difficulties in cleaning. The present disclosure, however, intentionally introduces water vapor (e.g., in situ) at the end of the lifetime of the charge of the solid material via water vapor in the air, or via an active water bleed to intentionally liquefy the material for subsequent evacuation through the vacuum system.

Figure 4:
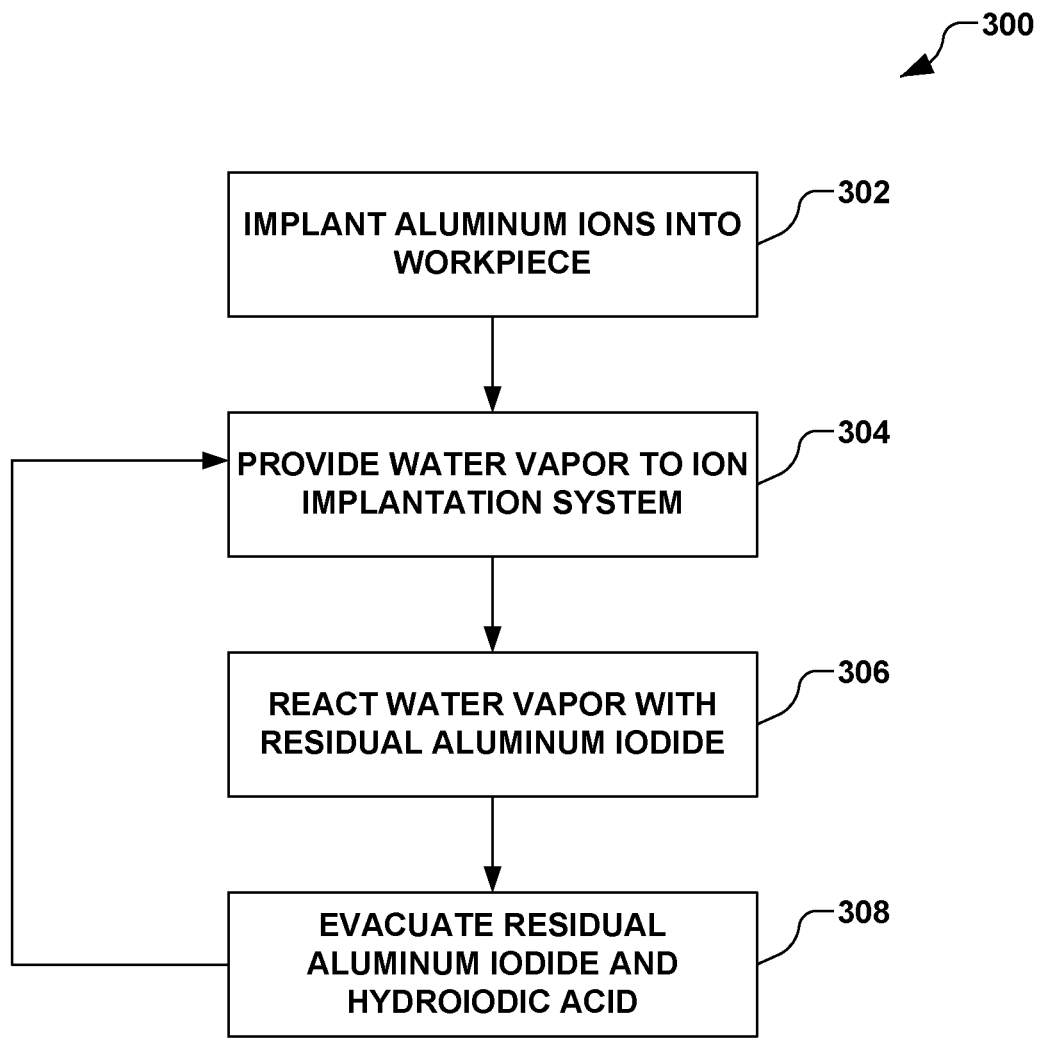
FIG. 4 illustrates an exemplary method for cleaning an ion implantation system that uses aluminum iodide as a source material.

The present disclosure thus introduces water or water vapor to liquefy or vaporize the remaining aluminum iodide and subsequently remove said liquefied or vaporized material through standard evacuation. FIG. 4 further illustrates an exemplary method 300 for such cleaning. The present disclosure appreciates that some manual cleaning may still be performed to remove stubborn deposits, but the majority of the aluminum iodide is advantageously removed via the water vapor. A manual cleaning can be further performed using isopropyl alcohol.

In accordance with one exemplary aspect of the disclosure, the method 300 comprises implanting aluminum ions into a workpiece via an ionization of aluminum iodide in act 302. Implanting aluminum ions in act 302, for example, may comprise the method 200 of FIG. 3. As illustrated in FIG. 4, the method 300 continues with introducing water vapor to the ion implantation system after implanting the aluminum ions in act 304. The introduction of water vapor in act 304 reacts the water vapor with residual aluminum iodide that has formed, sputtered, or otherwise been deposited on one or more internal surfaces of one or more components of the ion implantation system in act 306. The reaction of the water vapor with the residual aluminum iodide in act 306, for example, forms one or more products, such as hydroiodic acid and un-reacted residual aluminum iodide.

In act 308, the ion implantation system is evacuated, therein removing the one or more products of the reaction of the residual aluminum iodide and water, such as reacted and unreacted residual aluminum iodide and hydroiodic acid. The performance of acts 304, 306, and 308, for example, may be performed in-situ. Further, introducing water vapor in act 304, reacting the water vapor with the residual aluminum iodide in act 306, and evacuating the ion implantation system in act 308 may be performed iteratively.

It is noted that introducing water vapor to the ion implantation system in act 304 may comprise vaporizing water and introducing the vaporized water to an ion source of the ion implantation system. Accordingly, in act 306, the water vapor reacts with aluminum iodide that may been sputtered onto cool surfaces within the ion implantation system.

It is further noted that an argon ion beam may be formed concurrent with the introduction of water vapor in act 304, therein maintaining a warming environment within the ion implantation system. For example, the argon ion beam may be considered a shut down beam, whereby an active argon plasma is maintained in the arc chamber, thereby substantially preventing a non-ionizing environment concurrent with cooling down the ion implantation system.

In accordance with another example, water vapor is introduced while the ion source is cooling down. Further, a small amount of water vapor is introduced periodically, the system can be continually kept clean during operation, and a large amount of cleanup is not needed at the end.

Alternatively, one or more components of the ion implantation system may be exposed to a large amount of water vapor at the end of use of the source material, wherein the system is pumped down, and the exposure is repeated several times. Due to the low temperature characteristics, it is appreciated that warm components are not affected as much by the material build-up, and that build-up often occurs at non beam-strike areas.

In one example, at the end of a work cycle using a solid source material (e.g., the end of the production day), a "shut down beam" is run (e.g., an argon beam) to keep an active plasma in the arc chamber while the vaporizer temperatures are turned down and the material cools off, thus substantially preventing a non-ionizing environment while cooling down. Thus, the argon beam keeps the components warm, and during that period of cool down, a controlled amount of water vapor is injected into the system during the last hours of operation during the day.

As an alternative to the in-situ introduction of water vapor, a larger exposure of water vapor is introduced and the system and subsequently vented to air, whereby the aluminum iodide is liquefied or vaporized, and then pumped out via the vacuum system.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. An ion implantation system, comprising:
   an ion source configured to form an ion beam from aluminum iodide;
   a beamline assembly configured to selectively transport the ion beam;
   an end station configured to accept the ion beam for implantation of aluminum ions into a workpiece;
   a water delivery system configured to introduce water or water vapor to one or more of the ion source, beamline assembly, and end station, wherein the water delivery system is configured to react the water or water vapor with residual aluminum iodide formed on one or more internal surfaces of one or more the ion source, beamline assembly, and end station; and
   a vacuum system configured to substantially evacuate one or more of the ion source, beamline assembly, and end station, wherein the vacuum system is further configured to substantially remove one or more products of the reaction of the water or water vapor with the reacted residual aluminum iodide from the respective ion source, beamline assembly, and end station.

2. The ion implantation system of claim 1, further comprising:
   a solid-state material source comprising the aluminum iodide in a solid form; and
   a solid source vaporizer configured to vaporize the aluminum iodide, thus defining gaseous aluminum iodide, wherein the ion source comprises an arc chamber configured to form a plasma from the gaseous aluminum iodide and to dissociate aluminum ions from the gaseous aluminum iodide, and wherein the water delivery system is configured to introduce the water or water vapor to the arc chamber.

3. The ion implantation system of claim 2, where the ion source further comprises one or more extraction electrodes configured to extract the ion beam from the arc chamber, wherein the water delivery system is further configured to introduce the water or water vapor to the one or more extraction electrodes.

4. The ion implantation system of claim 2, wherein the solid source vaporizer comprises one or more heating elements configured to heat the aluminum iodide to a vaporization temperature.

5. The ion implantation system of claim 2, wherein the solid source vaporizer is configured to heat the aluminum iodide to between approximately 90° C. and 100° C.

6. The ion implantation system of claim 1, wherein the workpiece comprises silicon carbide.

7. The ion implantation system of claim 1, wherein the aluminum iodide is in one or more a powder form, a granular form, and a bulk solid form.

8. A method for cleaning one or more components of an ion implantation system, the method comprising:
   providing a residual aluminum iodide material on one or more internal surfaces of the one or more components;
   introducing water vapor to the one or more internal surfaces of the one or more components, therein reacting the residual aluminum iodide with the water vapor to form hydroiodic acid; and
   evacuating the ion implantation system, therein removing the residual aluminum iodide and hydroiodic acid.

9. The method of claim 8, comprising iteratively introducing the water vapor and evacuating the ion implantation system.

10. The method of claim 8, wherein the water vapor is introduced in-situ.

11. The method of claim 8, further comprising introducing the water vapor and evacuating the ion implantation system.

12. The method of claim 8, wherein providing the residual aluminum iodide material on the one or more internal surfaces of the one or more components comprises implanting ions aluminum ions into a workpiece via an ionization of aluminum iodide, wherein the residual aluminum iodide forms on the one or more internal surfaces of the one or more components.

13. The method of claim 8, wherein the one or more components comprise one or more of an ion source and an extraction electrode.

14. A method for cleaning an ion implantation system, wherein the method comprises:
   implanting ions aluminum ions into a workpiece via an ionization of aluminum iodide;
   introducing water vapor to the ion implantation system after implanting the aluminum ions, therein reacting the water vapor with residual aluminum iodide formed on one or more internal surfaces of one or more components of the ion implantation system; and
   evacuating the ion implantation system, therein removing one or more products of the reaction of the water vapor with the reacted residual aluminum iodide from the ion implantation system.

15. The method of claim 14, wherein reacting the water vapor with the residual aluminum iodide forms hydroiodic acid.

16. The method of claim 14, wherein introducing water vapor and evacuating the ion implantation system are performed iteratively.

17. The method of claim 14, wherein introducing water vapor to the ion implantation system comprises vaporizing water and introducing the vaporized water to an ion source of the ion implantation system.

18. The method of claim 14, wherein the water vapor reacts with aluminum iodide that has been sputtered onto cool surfaces within the ion implantation system.

19. The method of claim 14, further comprising forming an argon ion beam concurrent with the introduction of the water vapor to the ion implantation system, therein maintaining a warm environment within the ion implantation system.

20. The method of claim 14, further comprising performing a shut down beam concurrent with introducing water vapor to the ion implantation system, wherein the shut down beam comprises maintaining an active argon plasma in an arc chamber of the ion implantation system, thereby substantially preventing a non-ionizing environment concurrent with cooling down the ion implantation system.

* * * * *